Feb. 5, 1963

R. E. WILLIAMS 3,076,370

VIBRATO CIRCUIT

Filed Feb. 20, 1958

3,076,370

VIBRATO CIRCUIT

Richard E. Williams, Vienna, Va., assignor to Scope Incorporated, Falls Church, Va., a corporation of New Hampshire Filed Feb. 20, 1958, Ser. No. 716,442
18 Claims. (Cl. 84—1.25)

Figure 1:
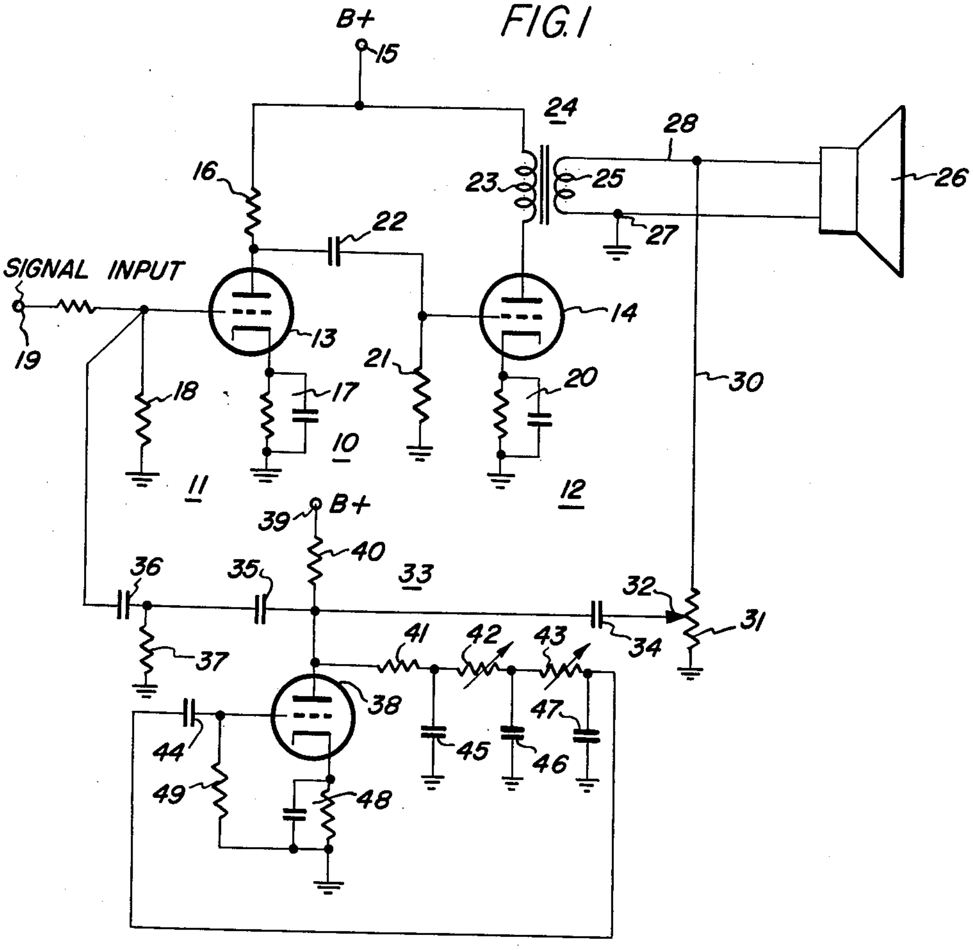

The present invention relates generally to modulators, and more particularly to frequency modulators capable of imparting smooth frequency modulation to a wide band of frequencies in a linear translatory channel such as an audio amplifier.

The present invention finds particular application to generation of vibrato effects in electronic organs or the like. It is desirable to impart a controllable vibrato to the tones generated by an electronic organ. This vibrato preferably should take the form of frequency excursions of approximately plus and minus 3% for each audio frequency of a complex tone, at a reiteration rate of 5 to 8 cycles per second. The problem of generating vibrato is individual to the several types of electronic organs presently known to the art. Those electronic organs which employ electronic oscillators for generating tones may develop vibrato by frequency modulating the oscillators. Since, however, a large number of oscillators are normally employed in such organs and since the frequency excursions desired are based on a percentage of the mean frequency of each tone, and a constant frequency excursion for the entire band generated by the instrument is not satisfactory, this type of vibrato production is undesirable.

The preferable mode of proceeding is to modulate the entire audio tone generated by the organ within a channel containing the entire total output of the organ. This has been accomplished heretofore, at least, in one type of organ, by introducing variable and reiterative phase shifts into the audio band by employing mechanically variable delay lines or constant phase difference networks, which are capable of imparting smoothly varying phase shifts of suitable constitution as phase delay is reiteratively modulated. Such techniques are inherently expensive.

In accordance with the present invention, an audio amplifier is provided with a negative feed-back loop. The latter is an RC high pass filter, capable of passing frequencies of about 30 c.p.s. and above, and cutting off in the vibrato frequency region. Such a filter introduces a phase shift which increases with frequency.

One of the resistance elements of the filter is a vacuum tube, which acts as a variable resistance. When the resistance of the tube is high, the RC filter has minimum attenuation and minimum phase shift. When the resistance of the tube is low, the RC filter introduces maximum attenuation and maximum phase shift.

The constants of the feed-back circuit are arranged to be such that for maximum amplitude of feed-back the phase of the feed-back is fully degenerative. As the amplitude of feed-back decreases, the phase shift introduced by the feed-back circuit departs from a value required to provide 180° relation to input phase, and approaches 0° and 360°. The changes in phase and amplitude occurring between output and input of the feed-back circuit are arranged to be complementary or compensatory, in their effects on total amplifier gain, and to meet the Nyquist criteria for amplifier stability, so that amplifier output remains of constant amplitude. The variable resistance tube is arranged to be part of a vibrato oscillator, operating at 6.5 c.p.s. preferably.

The phase shifts of feed-back signal which occur as the variable resistance tube oscillates results, then, in frequency modulation of the output of the oscillator at vibrato frequency. The RC filter then acts to block vibrato frequencies, i.e., 6.5 c.p.s. from both the input and output of the amplifier.

The primary purpose of the present invention is to provide a simple and inexpensive system for frequency modulating a wide band of signals being passed by an audio amplifier, in such fashion as to generate pleasing vibrato effects in the output of the amplifier.

It is another object of the present invention to provide a novel vibrato system capable of being applied to a wide band audio amplifier without interfering with the normal function and operation of the amplifier and which is wholly electronic.

Still another object of the invention resides in the provision of a vibrato circuit applicable to an audio amplifier, and consisting of a single vacuum tube or equivalent, which performs the function of vibrato oscillation generation, and of modulation.

A further object of the present invention resides in the provision of a vibrato circuit suitable for application to an audio amplifier which does not introduce amplitude modulation of appreciable amount in the output of the amplifier, and which introduces frequency modulation having excursions which are a function of the frequency of the audio signal being modulated.

Still another object of the invention resides in the provision of an audio amplifier including provision for frequency modulating the output of the amplifier by means of a circuit included in a feedback loop between the output and input of the amplifier.

A feature of the system of the present invention is that the circuit of the invention inherently eliminates vibrato thumps due to variations of amplitude of voltage in the vibrato circuit which occur at the vibrato rate.

Still a further advantage of the invention is that a high pass filter network is employed for feeding back signals from output to input of an amplifier, vibrato modulation of the feedback network providing greater vibrato excursion for the higher tones and smaller vibrato excursion for the lower tones, which is necessary for most effective vibrato in a musical sense.

As a further feature, the extent of the vibrato excursions may be readily controlled by means of a potentiometer which determines the amplitude of signal in the vibrato generating feed-back circuit, so that the circuit may be readily adjusted for a variety of vibrato excursions, or that the vibrato excursions may be readily controlled over a considerable range without requiring complex circuitry and without requiring selection of vibrato oscillators.

Still a further feature of the present invention is that the modulated feed-back circuit of the invention does not affect the normal operation of any amplifier to which it may be connected, if an adjustable feed-back control potentiometer is turned down all the way so that no feed-back occurs. Moreover, the modulated feed-back circuit is of such nature that it is readily operable from the low output impedance of an amplifier, but is capable of feeding into the high input impedance of that amplifier without loading the amplifier.

Figure 2:
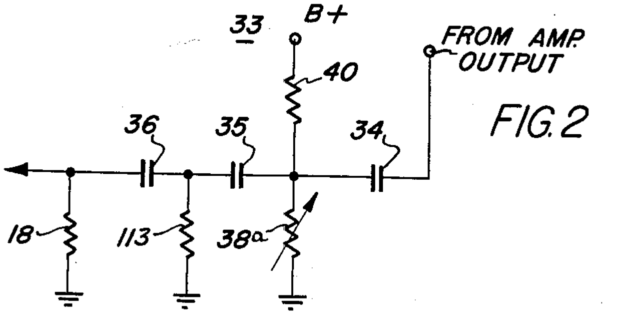

The above and still further objects, features and advantages of the present invention will become apparent upon consideration of the following detailed description of one specific embodiment thereof, especially when taken in conjunction with the accompanying drawings, wherein:

FIGURE 1 of the accompanying drawings is a schematic circuit diagram of an audio amplifier including a vibrato modulator, in accordance with the invention; and FIGURE 2 is a schematic circuit diagram of a simplified equivalent of a portion of the system of FIGURE 1.

Referring now more particularly to the accompanying drawings, and particularly to FIGURE 1 of the accompanying drawings, there is provided an audio amplifier 10, having two stages 11 and 12, of which the first stage 11 is a driver stage and the second stage 12 is a power output stage. For purposes of simplicity of exposition the stage 11 is shown as including a single vacuum tube 13 of the triode type, and the stage 12 is likewise shown as including a single tube 14 of the triode type. A B+ terminal 15 is provided which may be connected to a suitable B+ source (not shown). In series with the terminal 15 is connected a resistive load 16, which proceeds to the anode of the triode 13. The cathode of the triode 13 is connected to ground through a conventional RC bias circuit 17. The grid of the triode 13 is connected to ground through a grid bias resistance 18, and a signal input terminal 19 is connected to the grid of the triode 19 in any conventional fashion.

The triode 14 includes an anode, cathode and grid, the cathode being connected to ground through a conventional RC bias circuit 20 and the grid being connected to ground through a conventional grid leak resistance 21. The anode of the triode 13 is coupled to the grid of the triode 14 via a coupling condenser 22. Between the B+ terminal 15 and the anode of the triode 14 is included the primary winding 23 of an output transformer 24, having a secondary winding 25. The secondary winding 25 may be used to drive a conventional loud-speaker 26 and may have one of its leads grounded as at 27. From the remaining lead 28, which extends between the secondary winding 25 and the loud-speaker 26, is taken a lead 30 which proceeds to ground via a potentiometer 31. It follows that across the potentiometer 31 appears a replica of the voltage applied to the loud-speaker. The resistance value of the potentiometer 31 is selected to be sufficiently high that the operation of the loud-speaker is virtually unaffected by the presence of that resistance.

A variable tap 32 is included in the potentiometer 31. From this tap extends a loop back to the grid of the triode 13, which consists of series condensers 34, 35, 36 connected between the tap 32 and the grid of the triode 13. From the junction of condensers 35, 36 to ground is provided a resistance 37. From the junction of the condensers 34 and 35 to ground is connected a triode tube 38, which performs the function of a resistance, but in the case of the triode 38 the resistance is one which is electronically variable. The combination of condensers 34, 35, 36, resistance 37 and the resistance of triode 38, constitute a high pass filter, of conventional type. The anode of the triode 38 is connected to a B+ terminal 39 via a load resistance 40.

Considering now the circuitry of the triode 38, the anode of the triode 38 is connected back to the control grid via resistances 41, 42, 43 and condenser 44, all taken in series. The junction of resistances 41, 42 is connected to ground through a condenser 45. The junction of resistances 42, 43 is connected to ground through a condenser 46 and the junction of resistance 43 and condenser 44 is connected to ground through a condenser 47. The cathode of the triode 38 is connected to ground through the conventional RC bias network 48 and the grid of the triode 38 is connected to ground through a conventional grid leak resistance 49. The several resistances and condensers connected between the anode and the control grid of the tube 38 function as a phase shift feedback circuit, which causes the circuit of triode 38 to oscillate at a predetermined frequency established by the circuit constants.

In a practical embodiment of the present invention the frequency of oscillation is 6.5 c.p.s. The resistance 40 and the resistance 41 are each selected to have a value of the order of 500,000 ohms. Thereby the anode of the triode 38 is at a relatively high voltage with respect to ground. As the oscillator oscillates at its natural rate, the plate resistance to ground varies at vibrator frequency, i.e., at the rate of oscillation of the oscillator. It thus is the case that the high pass filter 33 effectively includes a variable shunt resistance which is variable at the vibrato rate. The high pass filter 33 constitutes a phase shift circuit, the total phase delay of which is then a function of the resistance of the triode 38, and so varies at the vibrato rate.

A signal as seen at the anode of the vibrato tube 38 consists of a large excursion in voltage at the vibrator rate, and riding this excursion a tone signal component, the phase and amplitude of which for any frequency also varies at the vibrato rate. The feedback loop 33, considered as a high-pass filter, introduces lower phase shifts at higher frequencies for any given instantaneous value of resistance of the tube 38, but a higher rate of change of phase for higher frequencies, the phase shift rates introduced at vibrato frequency by the varying internal resistance of the tube 38 are then a function of frequency, increasing with increasing frequency, so that the frequency excursions increase as a function of audio frequency.

In conventional terminology the phase shift in a high-pass filter decreases as the applied frequency increases. The variation in phase shift is at a maximum where $X_c \to R$ ($\angle 45°$ point) and R is varied about this value. One way of looking at this is to note that when all capacitive reactances ($X_c$) approach zero, the circuit is resistive, yielding zero shift. Similarly, if circuit $X_c \gg R$, the circuit approches, the assymtotic shift of 90° per section, and variations in R yield trivial shifts. In the circuit design, element 38*a* is chosen to equal the $X_c$ 34 at a frequency toward the higher end of frequencies of interest, say 2000 c.p.s.

Reference is now made to FIGURE 2 of the accompanying drawings, wherein is illustrated schematically the high-pass filter 33 of FIGURE 1 of the accompanying drawings, the triode 38 being illustrated as a variable resistance 38*a* and the other corresponding elements of FIGURES 1 and 2 being identified by the same numerals of reference.

It will now be apparent that the circuit 33 is a conventional RC high-pass filter, having a phase shift which is an increasing function of input frequency and which is with time a function of the value of resistance 38*a*, and variation of phase which is a direct function. It will be further realized, however, that the filter 33 will introduce amplitude variations as well as phase variations. In this respect it will be noted that when the value of resistance 38*a* is at a maximum, the circuit 33 attenuates least, and accordingly, the output amplitude is at its maximum. It is at this time that the circuitry introduces phase shift such that the fed-back voltage is completely degenerative. When, on the other hand, the resistance 38*a* is at a minimum value, the circuit 33 is more highly attenuating, and moreover its phase shift if then arranged to approach 0° or 360°, i.e., to approach more nearly the in-phase condition.

If the signal as seen across the resistance 38*a*, i.e., as seen at the anode of the triode 38, were directly returned to the input of the amplifier, very large excursions in voltage which occur at the anode of the triode 38 due to current variations in load resistance 40 during oscillations of the oscillator circuits would cause load thumps in the amplifier. This is a major problem in any vibrato circuit.

In the present invention, however, the anode of the triode 38 is coupled to the input of the triode 13 through a high pass filter consisting of capacitances 35, 36 and resistances 37 and 18. Since the vibrato frequency is extremely low, say 6.5 c.p.s., the coupling network between the anode of the triode 38 and the grid of the triode 13 efficiently attenuates amplitude variations at the anode of the triode 38, which are of vibrato frequency, so that they are essentially eliminated at the grid of the triode 13. This filter, of course, also introduces phase shift of the tone signal frequency. When we consider the total phase shift of the feedback loop, in relation to the stability of the amplifier 10, we must so design the system that the classical Nyquist stability criterion is met by the closed loop consisting of the amplifier and feedback network. In respect to gain of the amplifier without feedback, and in response to loss between slider 32 and the grid of triode 13, it is well-known that the loop gain must be less than unity at the zero or 360° phase-shift points of the system if the amplifier is to be stable.

In the present system the circuit has been arranged through choice of components of the feed-back network so that when a maximum amplitude signal is fed back, i.e., when the resistance of the triode 38 is a maximum, the fed-back signal is substantially out-of-phase with the input signal, which meets the Nyquist criteria and results in stability. Similarly, when the fed-back amplitude is low, the signal is allowed to shift closer to the in-phase condition. For low amplitude feed-back, obviously, a nearer approach to phase coincidence of input signal and fed-back signal may be tolerated. Moreover, the total gain of the amplifier with the feed-back loop in circuit is a function not only of loss in the feed-back network, but also of phase shift in the feed-back network. These two factors are arranged to complement each other so that, for the condition described, the amplitude of output of the amplifier stage remains relatively constant. The phase of output is, however, shifted reiteratively at the vibrato rate. This rate of change of phase is equivalent to a frequency modulation, and a very pleasing vibrato effect results without accompanying annoying amplitude variations.

The system of the present invention yields various advantages, the characters of which are obvious from the description. The most important ecomonic advantage resides in the fact that only a single triode is required both to generate a vibrato frequency and also to modulate the output of an audio amplifier at the vibrato rate and with the required frequency exrcursions.

While I have described and illustrated one specific embodiment of my invention, it will be clear that variations of the details of construction which are specifically illustrated and described may be resorted to without departing from the true spirit and scope of the invention as defined in the appended claims.

What I claim is:

1. A phase modulator, comprising an amplifier having an input circuit and an output circuit, means for supplying a broad band of audio signals applied to said input circuit, means for deriving said broad-band of signals at said output circuit, a negative feed-back circuit connected between said input circuit and said output circuit, a controllable electronic phase shift circuit for said broad-band of signals included in said negative feed-back circuit, and means coupled to a component of said last named circuit for periodically varying the electrical impedance value of said component of said controllable phase shift circuit, which controls the phase shift introduced by said phase shift circuit sufficiently to produce frequency vibrato.

2. The combination according to claim 1, wherein said phase shift circuit is a high pass filter.

3. The combination according to claim 1, wherein said phase shift circuit is a high pass filter having substantial cutoff below about 10 c.p.s.

4. The combination according to claim 1, wherein said phase shift circuit is a high pass filter including at least one series condenser and at least one shunt resistance.

5. The combination in accordance with claim 4, wherein said at least one shunt resistance is a controllable electronic resistance and corresponds with said component.

6. The combination according to claim 1, wherein said phase shift circuit is a high pass filter including at least one series condenser and at least one shunt resistance, said resistance being the internal resistance of a vacuum tube, and passive circuitry connected to said vacuum tube and constituting with said vacuum tube a self-oscillator.

7. A vibrato-modulation circuit, comprising an audio amplifier having an input circuit and an output circuit, said audio amplifier including a negative feed-back circuit for coupling a feedback signal from the output circuit to the input circuit, said feedback circuit extending between said output circuit and said input circuit, said negative feed-back circuit including means for shifting the phase of the fed-back signal periodically with respect to a mean value, said last named means including an oscillator oscillating at vibrato frequency, and including one amplifying unilateral control device, said device being included as a phase shift control device in said feed-back circuit.

8. The combination according to claim 7, wherein is included a high pass filter between said device and said input circuit, said high pass filter cutting off approximately at said vibrator frequency, whereby the oscillations generated by said oscillator are isolated from said input circuit.

9. The combination according to claim 8, wherein said means for shifting phase includes a high pass filter having said phase shift control device as an element, said high pass filter having an attenuation which is a direct function of its phase shift, the attenuation versus phase shift function maintaining the output of said audio amplifier substantially constant during said vibrator modulation.

10. A vibrato modulator, comprising an amplifier having an input circuit and an output circuit, a feed-back circuit connected between said input circuit and said output circuit, said feed-back circuit including a potentiometer connected between said output circuit and a point of reference potential, a vacuum tube oscillator comprising a vacuum tube having an anode, a grid and a cathode, means connecting said cathode to said point of reference potential, a phase shift circuit connected between said anode and said grid, the components of said phase shift circuit selected to cause oscillation of said oscillator at a sub-audible rate, a slider for said potentiometer, a capacitive connection between said slider and said anode, a high pass filter having a cut-off above said sub-audible rate connected between said anode and said input circuit, the characteristics of said feed-back circuit being such as to introduce high attenuation with high phase departure and low attenuation with low departure from a reference degenerative phase, and greater phase shift variations for higher than for lower frequencies.

11. In combination, a wide band amplifier having a negative feed-back circuit, said feed-back circuit including means for frequency modulating a wide band of frequencies translated by said wide band audio amplifier without substantial accompanying amplitude modulation, said last means comprising means for introducing periodically variable complementary phase shifts and attenuation changes into the transfer characteristic of said feed-back circuit.

12. A modulator, comprising an amplifier having a negative feed-back circuit, said feed-back circuit including means for phase modulating the output of said amplifier without accompanying gain variations, said means comprising means for introducing phase and attenuation variations into the transfer characteristics of said feed-back circuit which are mutually compensating in respect to variations of gain of said amplifier.

13. The combination according to claim 12, wherein said last-recited means comprises a filter in said feed-back circuit, said filter comprised of series condensers and shunt resistances, wherein one of said resistances is variable for providing said variable phase and attenuation transfer characteristic of said feed-back circuit.

14. A vibrato modulator, comprising an audio amplifier for amplifying a band of audio frequencies, said amplifier having a negative feed-back circuit, said feed-back circuit including means for phase modulating the output of said amplifier at a vibrato frequency and with phase excursions which are a direct function of frequency without substantial accompanying gain variations of said amplifier, said means including means for introducing vibrato frequency variations of phase and amplitude into the transfer characteristic of said feed-back circuit which are mutually compensating in respect to their effect on the gain characteristic of said amplifier.

15. The combination according to claim 13, wherein said feed-back circuit includes a high pass filter selected to pass said audio frequencies and to highly attenuate said vibrato frequency.

16. The combination according to claim 15, wherein said high pass filter includes an electronically variable shunt resistance.

17. The combination according to claim 16, wherein said electronically variable shunt resistance is included as the sole amplifiying element of a self-oscillator oscillating at said vibrato frequency.

18. The combination according to claim 17, wherein said high pass filter has a low input impedance and a high output impedance.

References Cited in the file of this patent

UNITED STATES PATENTS

| | | |
|---|---|---|
| 1,519,211 | Martin | Dec. 16, 1924 |
| 1,994,457 | Barnes | Mar. 19, 1935 |
| 2,102,671 | Black | Dec. 21, 1937 |
| 2,221,188 | Hammond | Nov. 12, 1940 |
| 2,233,759 | Werrmann | Mar. 4, 1941 |
| 2,245,354 | Mroz | June 10, 1941 |
| 2,245,365 | Riddle | June 10, 1941 |
| 2,261,335 | Broden | Nov. 4, 1941 |
| 2,307,308 | Sorensen | Jan. 5, 1943 |
| 2,322,884 | Roetken | June 29, 1943 |
| 2,485,538 | Rowe | Oct. 18, 1949 |
| 2,647,173 | Beurtheret | July 28, 1953 |
| 2,672,529 | Villard | Mar. 16, 1954 |
| 2,811,591 | Kennedy | Oct. 29, 1957 |
| 2,835,814 | Dore | May 20, 1958 |
| 2,892,373 | Bauer | June 30, 1959 |